United States Patent
Asahara et al.

(10) Patent No.: US 7,375,380 B2
(45) Date of Patent: May 20, 2008

(54) SEMICONDUCTOR LIGHT EMITTING DEVICE

(75) Inventors: Hirokazu Asahara, Kyoto (JP); Mitsuhiko Sakai, Kyoto (JP); Masayuki Sonobe, Kyoto (JP); Toshio Nishida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 139 days.

(21) Appl. No.: 10/551,922

(22) PCT Filed: Jul. 11, 2005

(86) PCT No.: PCT/JP2005/012749

§ 371 (c)(1),
(2), (4) Date: Oct. 5, 2005

(87) PCT Pub. No.: WO2006/006555

PCT Pub. Date: Jan. 19, 2006

(65) Prior Publication Data

US 2006/0273335 A1    Dec. 7, 2006

(30) Foreign Application Priority Data

Jul. 12, 2004    (JP) ............................. 2004-205094

(51) Int. Cl.
*H01L 27/15* (2006.01)
*H01L 29/22* (2006.01)

(52) U.S. Cl. ............................. 257/98; 257/99; 257/79; 257/81; 257/85; 257/94

(58) Field of Classification Search .................. 257/79, 257/81, 98, 99, 85, 94
See application file for complete search history.

(56) References Cited

U.S. PATENT DOCUMENTS 6,130,446 A * 10/2000 Takeuchi et al. .............. 257/99

(Continued)

FOREIGN PATENT DOCUMENTS

CN    1472826 A    2/2004

(Continued)

OTHER PUBLICATIONS

"Improved External Efficiency InGaN-Based Light-Emitting Diodes with Transparent Conductive Ga-Doped ZnO as p-Electrodes", Ken Nakahara et al.: Japanese Journal of Applied Physics, vol. 43, No. 2A; the Japan Society of Applied Physics; 2004; Ibaraki 305-8568, Japan; 2004; pp. L180-L182.

(Continued)

*Primary Examiner*—Kenneth Parker
*Assistant Examiner*—Joseph Nguyen
(74) *Attorney, Agent, or Firm*—Rabin & Berdo, PC (57) ABSTRACT

A semiconductor light emitting device includes a semiconductor light emitting portion having a first contact layer of a first conductivity, a second contact layer of a second conductivity and an active layer sandwiched between the first and second contact layers. The device further includes a transparent electrode which substantially entirely covers a surface of the second contact layer in ohmic contact with the surface of the second contact layer and is transparent to a wavelength of light emitted from the semiconductor light emitting portion, and a metal reflection film which is opposed to substantially the entire surface of the transparent electrode and electrically connected to the transparent electrode, and reflects the light emitted from the semiconductor light emitting portion and passing through the transparent electrode toward the semiconductor light emitting portion.

13 Claims, 7 Drawing Sheets

U.S. PATENT DOCUMENTS

| | | |
|---|---|---|
| 2003/0010986 A1* | 1/2003 | Lin et al. .................. 257/79 |
| 2003/0178626 A1* | 9/2003 | Sugiyama et al. ............ 257/79 |
| 2004/0016936 A1 | 1/2004 | Tanaka et al. |
| 2004/0113156 A1* | 6/2004 | Tamura et al. ............... 257/79 |
| 2004/0164314 A1* | 8/2004 | Nakahara .................. 257/103 |
| 2005/0205884 A1* | 9/2005 | Kim et al. .................. 257/98 |

FOREIGN PATENT DOCUMENTS

| | | |
|---|---|---|
| JP | 2003-218383 | 7/2003 |
| JP | 2003-224297 | 8/2003 |
| JP | 2004-158546 | 6/2004 |
| JP | 2004-179365 | 6/2004 |

OTHER PUBLICATIONS

"InGanN/GaN quantum-well heterostructure light-emitting diodes employing photonic crystal structures", J. J. Wierer et al.: Applied Physics Letters, vol. 84, No. 19; May 10, 2004; American Institute of Physics; pp. 3885-3887.

"Efficiency enhancement in a light-emitting diode with a two-dimensional surface grating photonic crystal", Hiroyuki Ichikawa et al.: Applied Physics Letters, vol. 84, No. 4; Jan. 26, 2004; American Institute of Physics; pp. 457-459.

* cited by examiner

SEMICONDUCTOR LIGHT EMITTING DEVICE

TECHNICAL FIELD

The present invention relates to a semiconductor light emitting device such as a gallium nitride light emitting diode.

BACKGROUND ART

A blue light emitting diode element, for example, includes an InGaN semiconductor light emitting portion provided on a surface of a sapphire substrate, and electrodes respectively provided on P- and N-sides of the InGaN semiconductor light emitting portion (see Patent Document 1 listed below). However, it is necessary to provide the P-side and N-side electrodes on the InGaN semiconductor light emitting portion and route wires from the electrodes, because the sapphire substrate is insulative. Therefore, light from the InGaN semiconductor light emitting portion is blocked by the electrodes and the like, so that the light extraction efficiency is low.

This problem is alleviated by employing a flip-chip structure in which the InGaN semiconductor light emitting portion is bonded to a mounting board in opposed relation to extract the light from the side of the sapphire substrate (see Patent Document 2 listed below).

In the light emitting diode element of the flip-chip type, one surface of the sapphire substrate is defined as a light extraction surface, and the other surface of the sapphire substrate is defined as a device formation surface on which the InGaN semiconductor light emitting portion is provided. The InGaN semiconductor light emitting portion includes an InGaN active layer sandwiched between an N-type GaN contact layer and a P-type GaN contact layer. For example, the N-type GaN contact layer is disposed adjacent to the sapphire substrate, while the P-type GaN contact layer is disposed adjacent to the mounting board. In this case, a P-side electrode film is provided on a surface of the P-type GaN contact layer. An N-type electrode film is provided on a portion of the N-type GaN contact layer exposed by removing parts of the P-type GaN contact layer and the InGaN active layer.

Further, a P-side pad electrode and an N-side pad electrode are respectively connected to the P-side electrode film and the N-side electrode film. These pad electrodes are bonded to the mounting board in opposed relation, thereby achieving flip-chip bonding of the light emitting diode.

Not all the light emitted from the InGaN semiconductor light emitting portion is extracted through the sapphire substrate, but the light is partly directed toward the P-type GaN contact layer. In order to increase the light extraction efficiency, the P-side electrode film should be composed of a material which not only provides ohmic contact with the P-type GaN contact layer but also has a sufficient reflectivity. This imposes heavy restrictions on device production, making it difficult to form a P-side electrode film having a smaller contact resistance and a higher reflectivity.

Patent Document 1: Japanese Patent Publication No.

Patent Document 2: Japanese Unexamined Patent Publication No. 2003-224297

DISCLOSURE OF THE INVENTION

Means for Solving the Problems

It is an object of the present invention to provide a semiconductor light emitting device of a flip-chip type including a semiconductor light emitting portion bonded to a mounting board in opposed relation and having a light extraction efficiency improved by alleviating restrictions on electrodes disposed adjacent to the mounting board.

The semiconductor light emitting device according to the present invention comprises a semiconductor light emitting portion having a first contact layer of a first conductivity (one of P- and N-types), a second contact layer of a second conductivity (the other of the P- and N-types) and an active layer sandwiched between the first and second contact layers, a transparent electrode which substantially entirely covers a surface of the second contact layer in ohmic contact with the surface of the second contact layer and is transparent to a wavelength of light emitted from the semiconductor light emitting portion, and a metal reflection film which is opposed to substantially the entire surface of the transparent electrode and electrically connected to the transparent electrode, and reflects the light emitted from the semiconductor light emitting portion and passing through the transparent electrode toward the semiconductor light emitting portion.

With this arrangement, the transparent electrode is provided on the surface of the second contact layer of the semiconductor light emitting portion, and the metal reflection film is disposed on a back side of the transparent electrode as seen from the side of the semiconductor light emitting portion. Thus, the light emitted from the semiconductor light emitting portion and passing through the transparent electrode is reflected on the metal reflection film toward the semiconductor light emitting portion, thereby providing an excellent light extraction efficiency.

In addition, there is no need to provide ohmic contact between the metal reflection film and the semiconductor light emitting portion, because the transparent electrode covers substantially the entire surface of the second contact layer. This permits a wider choice of materials for the metal reflection film, making it possible to further increase the light extraction efficiency by selecting a higher reflectivity material or to reduce costs by selecting a less expensive material.

The expression "transparent to the wavelength of the emitted light" herein specifically means, for example, that the transmittance with respect to the emitted light wavelength is not lower than 60%.

The semiconductor device may further comprise a transparent substrate which is transparent to the wavelength of the light emitted from the semiconductor light emitting portion, and has a light extracting surface defined by one surface thereof through which the light emitted from the semiconductor light emitting portion is extracted to the outside, and a device formation surface defined by the other surface thereof on which the semiconductor light emitting portion is provided, the device formation surface of the transparent substrate being opposed to the first contact layer.

A sapphire substrate is preferably used as the transparent substrate, but other examples of the transparent substrate include transparent substrates of SiC, GaN, ZnO and the like.

The semiconductor light emitting portion preferably has an LED (light emitting diode) structure based on a III-V nitride compound semiconductor. More specifically, the semiconductor light emitting portion may have a construction such that an InGaN active layer is sandwiched between a P-type GaN contact layer and an N-type GaN contact layer. Alternatively, the semiconductor light emitting portion may have a construction such that an AlGaN active layer is sandwiched between a P-type AlGaN contact layer and an N-type AlGaN contact layer. Further, the active layer may have a multi-quantum-well (MQW) structure.

The semiconductor, light emitting device may further comprise a transparent insulation film disposed between the transparent electrode and the metal reflection film. In this case, the metal reflection film is preferably connected to the transparent electrode via an opening formed in the transparent insulation film.

With this arrangement, the transparent insulation film is disposed between the transparent electrode and the metal reflection film, so that the reflection of the light from the semiconductor light emitting portion mostly occurs in an interface between the transparent insulation film and the metal reflection film. Since virtually no light absorption occurs in an insulator/metal interface, the light extraction efficiency can be further improved.

Further, the metal reflection film and the transparent electrode are electrically connected to each other via the opening formed in the transparent insulation film, so that the metal reflection film functions as an electrode for connection to a mounting board.

The opening formed in the transparent insulation film preferably has the smallest possible area which ensures the electrical connection between the metal reflection film and the transparent electrode. More specifically, the area ratio of the opening to the transparent electrode film is preferably 1 to 30% (e.g., about 7%).

Exemplary materials for the insulation film transparent to the emitted light wavelength include $SiO_y$ (0<y), SiON, $Al_2O_3$, $ZrO_2$ and $SiN_z$ (0<z).

The semiconductor light emitting device preferably further comprises an electrode portion extending from the first contact layer toward the metal reflection film. With this arrangement, the second contact layer is bonded to the mounting board through the metal reflection film, and the first contact layer is bonded to the mounting board via the electrode portion. Thus, flip-chip connection can be achieved.

The transparent electrode preferably comprises a $Zn_{1-x}Mg_xO$ (wherein $0 \leq x<1$) film. $Zn_{1-x}Mg_xO$ (wherein $0 \leq x<1$ and, when x=0, ZnO) provides excellent ohmic contact with a GaN semiconductor layer, and has a transmittance of not lower than 80% with respect to light of a wavelength range of 370 nm to 1000 nm. This makes it possible to reduce the contact resistance and further increase the efficiency of light extraction through the front electrode.

The foregoing and other objects, features and effects of the present invention will become more apparent from the following description of embodiments with reference to the attached drawings.

EMBODIMENTS OF THE INVENTION

Figure 1:
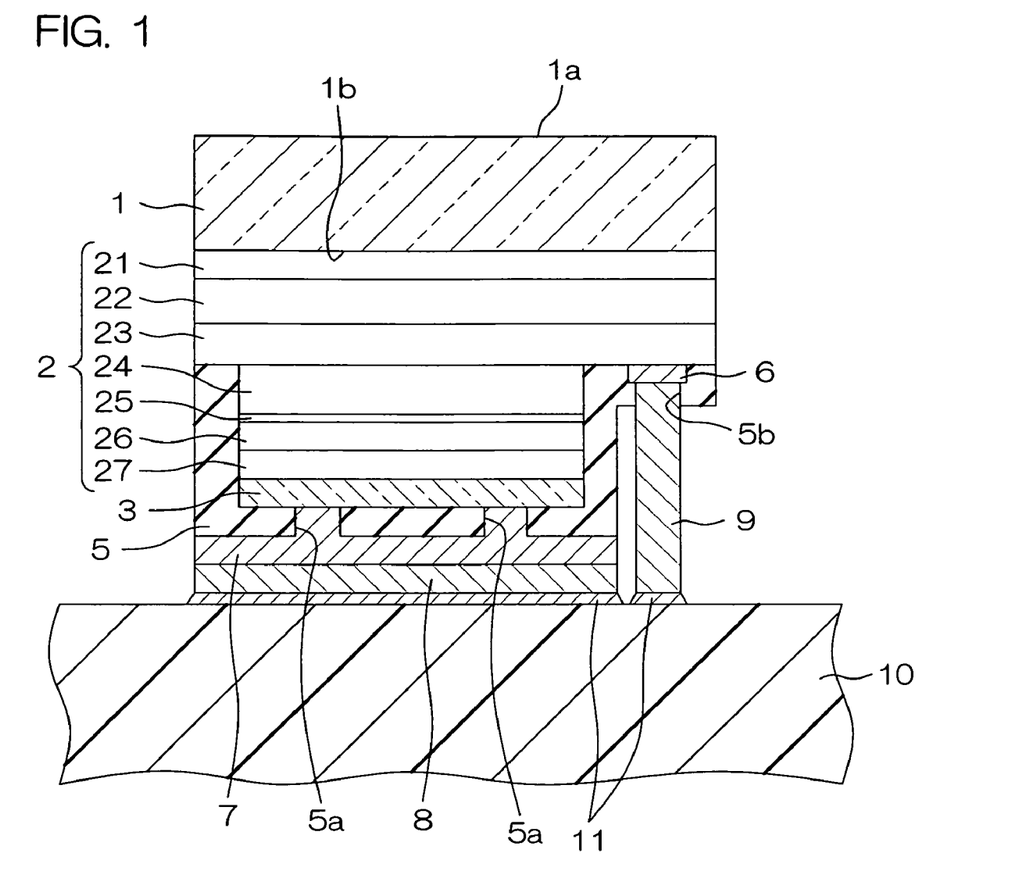
FIG. 1 is a sectional view schematically illustrating the construction of a light emitting diode element according to one embodiment of the present invention.

FIG. 1 is a sectional view schematically illustrating the construction of a light emitting diode element according to one embodiment of the present invention. The light emitting diode element is of a flip-chip type, and includes a sapphire substrate 1 as a transparent substrate, an InGaN semiconductor light emitting portion 2 provided on the sapphire substrate 1, and a P-side transparent electrode 3 covering a surface of the InGaN semiconductor light emitting portion 2 opposite from the sapphire substrate 1. The sapphire substrate 1 has a light extracting surface 1a defined by one surface thereof and a device formation surface 1b defined by the other surface thereof. The InGaN semiconductor light emitting portion 2 is provided on the device formation surface 1b.

The sapphire substrate 1 is an insulative substrate which is transparent to the wavelength (e.g., 460 nm) of light emitted from the InGaN semi conductor light emitting portion 2. The InGaN semiconductor light emitting portion 2 includes a Si-doped N-type GaN contact layer 23 provided on the side of the sapphire substrate 1, a Mg-doped P-type GaN contact layer 27 provided opposite from the sapphire substrate 1, and InGaN active layers 24, 25 provided between the N-type GaN contact layer 23 and the P-type GaN contact layer 27. The InGaN active layers 24 and 25 have, for example, a mono-quantum-well structure and a multi-quantum-well (MQW) structure, respectively, which are stacked in a laminate structure. More specifically, the InGaN semiconductor light emitting portion 2 is constituted by a buffer layer 21, an undoped GaN layer 22, the N-type GaN contact layer 23, the InGaN active layers 24, 25, a Mg-doped P-type AlGaN clad layer 26 and the P-type GaN contact layer 27, which are stacked on the sapphire substrate 1 in this order from the sapphire substrate 1. The P-side transparent electrode 3 ohmically contacts substantially the entire surface of the P-type GaN contact layer 27.

In the InGaN semiconductor light emitting portion 2, layers ranging from the InGaN active layer 24 to the P-type GaN contact layer 27 inclusive have the same pattern formed by etching, so that the N-type GaN contact layer 23 has an exposed surface portion. An N-side electrode 6 is provided on the exposed surface portion of the N-type GaN contact layer 23.

A transparent insulation film 5 is provided on the entire surface of the P-side transparent electrode 3 which substantially entirely covers a surface of the P-type GaN contact layer 27. Further, the transparent insulation film 5 entirely covers the InGaN semiconductor light emitting portion 2, functioning as a passivation film. The transparent insulation film 5 has a plurality of openings 5a through which surface portions (minute areas) of the P-side transparent electrode 3 are exposed, and an opening 5b through which a surface portion of the N-side electrode 6 is exposed. Further, a reflective electrode 7 of a metal material is provided on a surface portion of the transparent insulation film 5 (opposite from the InGaN semiconductor light emitting portion 2) as substantially entirely covering a region of the transparent insulation film 5 opposed to the P-type GaN contact layer 27. The reflective electrode 7 is covered with a P-side pad electrode 8 such as of Au. The reflective electrode 7 is connected to the P-side transparent electrode 3 via the openings 5a, whereby the P-side transparent electrode 3, the reflective electrode 7 and the P-side pad electrode 8 are electrically connected.

On the other hand, a columnar N-side pad electrode 9 projects from the N-side electrode 6. The N-side pad electrode 9 is connected to the N-side electrode 6 via the opening 5b of the transparent insulation film 5.

With this arrangement, the P-side pad electrode 8 and the N-side pad electrode 9 are bonded to a mounting board 10 in opposed relation to the mounting board 10. A reference numeral 11 denotes a brazing material such as solder.

The P-side transparent electrode 3 is an electrically conductive layer which is composed of, for example, $Zn_{1-x}Mg_xO$ (wherein $0 \leq x < 1$ and, when x=0, ZnO) and transparent to the wavelength of the light emitted from the InGaN semiconductor light emitting portion 2. $Zn_{1-x}Mg_xO$ (particularly, Ga-doped ZnO) has a lattice constant approximate to that of GaN, thereby providing excellent ohmic contact with the P-type GaN contact layer 27 of the InGaN semiconductor light emitting portion 2 without the need for post-annealing (see Ken Nakahara, et al., "Improved External Efficiency InGaN-Based Light-Emitting Diodes with Transparent Conductive Ga-Doped ZnO as p-Electrodes", Japanese Journal of Applied Physics, Vol. 43, No. 2A, 2004, pp. L180-L182). $Zn_{1-x}Mg_xO$ has a transmittance of not lower than 80%, for example, with respect to the light wavelength of 370 nm to 1000 nm. Therefore, the use of $Zn_{1-x}Mg_xO$ allows the P-side transparent electrode 3 to have a lower contact resistance to the P-type GaN contact layer 27 and a higher transmittance.

The P-side transparent electrode 3 is formed, for example, by a molecular beam epitaxial (MBE) method. The P-side transparent electrode 3 has a thickness of 1000 to 100000 Å (e.g., about 5000 Å).

Exemplary metal materials for the reflective electrode 7 include Al, Ag, Pd, In and Ti. The reflective electrode 7 is formed by depositing any of these metal materials on the surface of the transparent insulation film 5 by a sputtering method or a vapor deposition method. Where Al is used, for example, the thickness is 500 to 10000 Å (e.g., about 1000 Å).

The transparent insulation film 5 is composed of, for example, $SiO_y$, SiON, $Al_2O_3$, $ZrO_2$ or $SiN_z$, which is transparent to the wavelength of the light emitted from the InGaN semiconductor light emitting portion 2. The transparent insulation film 5 is formed, for example, by a sputtering method or a CVD (chemical vapor deposition) method. The transparent insulation film 5 has a thickness t which is arbitrarily determined so as to impart the transparent insulation film 5 with a sufficient insulative property. Where the transparent insulation film 5 is composed of a $SiO_2$ film, for example, the thickness t is preferably 800 Å×(odd number). The thickness t is expressed as $t = \lambda/(4 \cdot n) \times$(odd number) wherein $\lambda$ is the wavelength (=460 nm) of the light emitted from the InGaN semiconductor light emitting portion 2 and n is the refraction index (=1.46) of $SiO_2$. The thickness t satisfies conditions for providing the maximum reflection efficiency in an interface between the transparent insulation film 5 and the reflective electrode 7.

With the aforesaid arrangement, when a voltage is applied in a forward direction between the P-side pad electrode 8 and the N-side pad electrode 9, blue light having a wavelength of 460 nm is emitted from the InGaN semiconductor light emitting portion 2. The light passes through the sapphire substrate 1 and is extracted through the light extracting surface 1a. The light directed toward the P-side transparent electrode 3 from the InGaN semiconductor light emitting portion 2 passes through the P-side transparent electrode 3 and further through the transparent insulation film 5, and is incident on the reflective electrode 7 to be reflected on the reflective electrode 7. The reflected light is directed toward the sapphire substrate 1, and extracted through the light extracting surface 1a. Thus, the light can be extracted at a higher efficiency. An insulator/metal interface is defined between the transparent insulation film 5 and the reflective electrode 7, so that virtually no light absorption occurs in the interface. Therefore, an excellent light extraction efficiency can be achieved.

In the light emitting diode element according to this embodiment, the P-side transparent electrode 3 is bonded to the surface of the P-type GaN contact layer 27, and the reflective electrode 7 is provided on the P-side transparent electrode 3 with the intervention of the transparent insulation film 5. Hence, there is no need to consider the suitability of the ohmic contact with the P-type GaN contact layer 27 when the material for the reflective electrode 7 is selected. This permits a wider choice of materials for the reflective electrode 7, making it possible to provide a device having a higher light extraction efficiency by selecting a higher reflectivity material and to reduce production costs by selecting a less expensive metal material.

Figure 2:
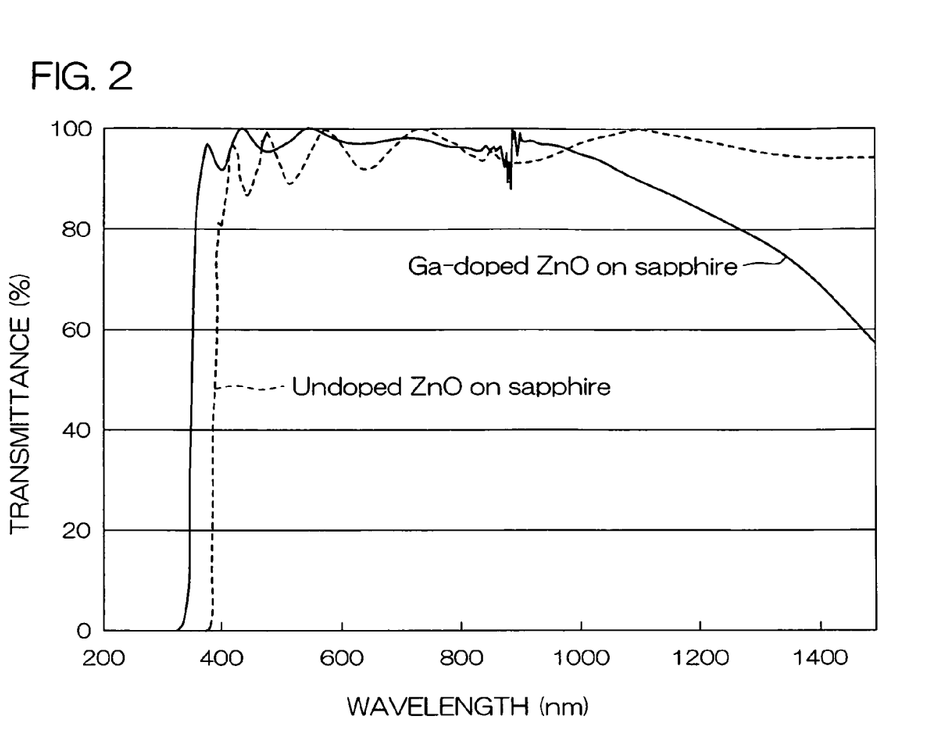
FIG. 2 illustrates the results of measurement of the transmittance of a ZnO film formed on a sapphire substrate.
Figure 3:
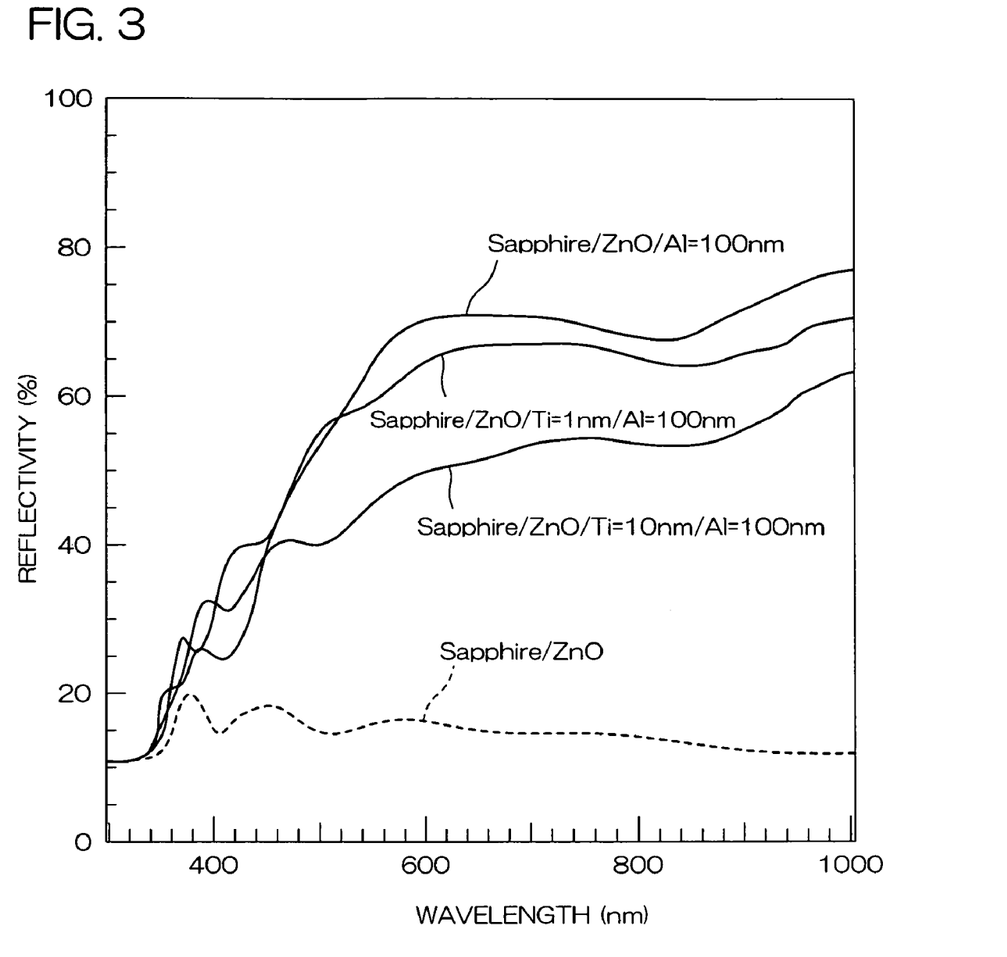
FIG. 3 illustrates the results of measurement of the reflectivity of a structure including a ZnO film formed on a sapphire substrate and a reflective metal layer formed on the ZnO film as observed from the side of the sapphire substrate.
Figure 4:
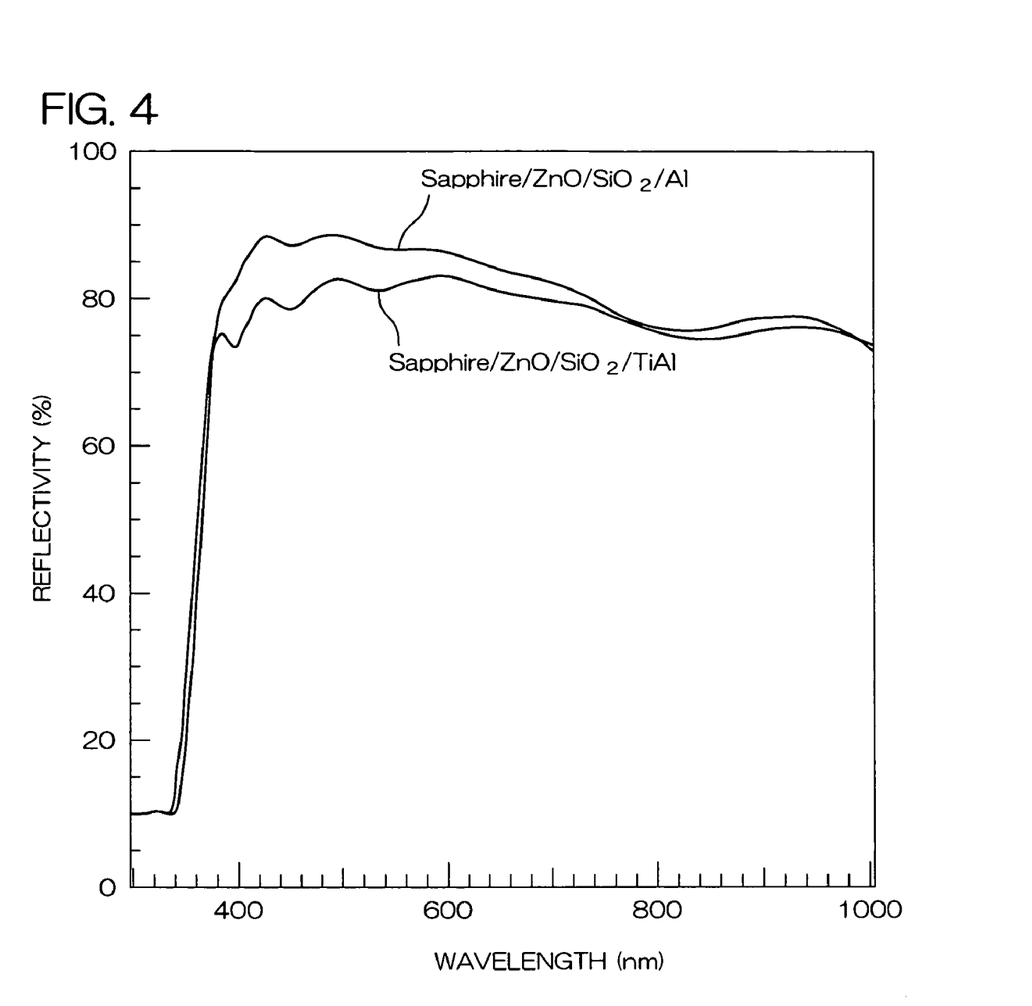
FIG. 4 illustrates the results of measurement of the reflectivity of a laminate structure including a ZnO film, a $SiO_2$ film and a reflective metal layer formed in this order on a sapphire substrate as observed from the side of the sapphire substrate.

FIGS. 2, 3 and 4 are diagrams for explaining the effects of the transparent insulation film 5. FIG. 2 illustrates the results of measurement of the transmittance of a ZnO film formed on a sapphire substrate, and FIG. 3 illustrates the results of measurement of the reflectivity of a structure including a ZnO film formed on a sapphire substrate and a reflective metal layer formed on the ZnO film as observed from the side of the sapphire substrate. Further, FIG. 4 illustrates the results of measurement of the reflectivity of a laminate structure including a ZnO film, a $SiO_2$ film and a reflective metal layer formed in this order on a sapphire substrate as observed from the side of the sapphire substrate.

As shown in FIG. 2, ZnO deposited on the sapphire substrate has a very high transmittance. Therefore, where the reflective metal layer of a high reflectivity metal such as Ag or Al is formed on the ZnO layer, the reflectivity of the resulting structure measured from the side of the sapphire substrate is expected to be equivalent to that of the reflective metal layer alone.

In practice, however, where the reflective metal layer is bonded directly to the ZnO layer, a desired reflectivity is not provided as shown in FIG. 3. Although principles for this are not clarified in detail, silver gray metals such as Ag and Al provide ohmic contact with the Ga-doped ZnO. This supposedly deteriorates the reflectivity of the reflective metal layer.

Where a transparent insulation film is disposed between the ZnO layer and the reflective metal layer, the reflective metal layer exhibits its inherent high reflectivity as shown in FIG. 4.

Figure 5:
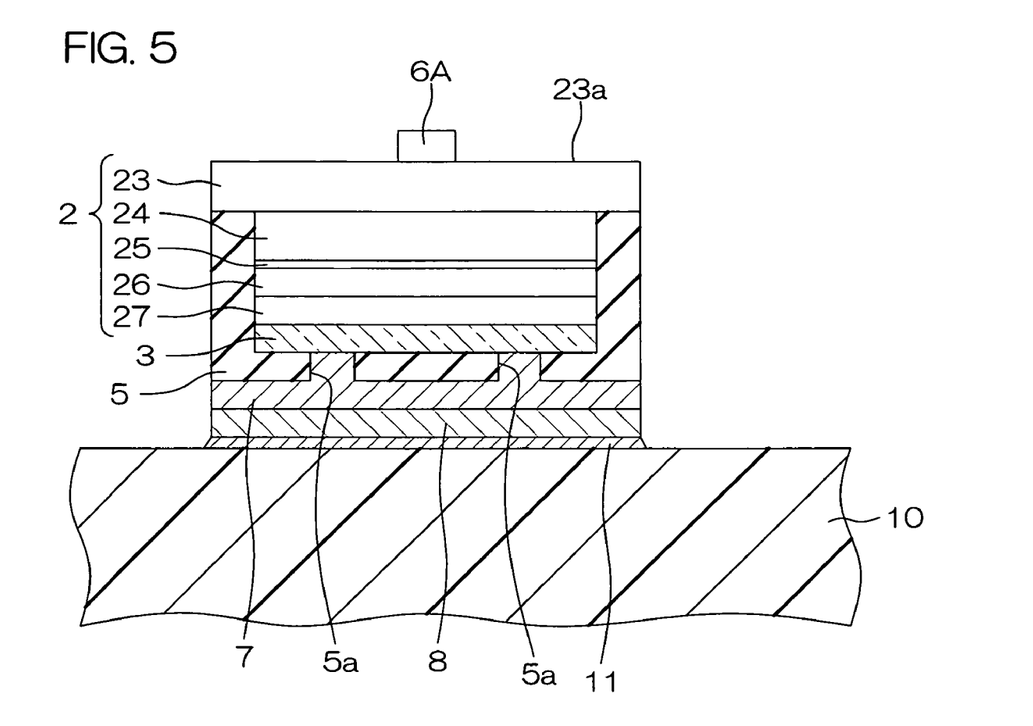
FIG. 5 is a sectional view schematically illustrating the construction of a light emitting diode element according to another embodiment of the present invention.

FIG. 5 is a sectional view schematically illustrating the construction of a light emitting diode element according to another embodiment of the present invention. In FIG. 5, components corresponding to those shown in FIG. 1 will be denoted by the same reference characters as in FIG. 1.

In this embodiment, the N-type GaN contact layer 23 is the uppermost layer without the provision of the sapphire substrate 1, and has a light extracting surface defined by a surface 23a thereof (opposite from the mounting board 10). An N-side electrode 6A is provided on the surface 23a defined as the light extracting surface. The light emitting diode element having such a construction is produced, for example, by forming the structure shown in FIG. 1 and then polishing away the sapphire substrate 1, the buffer layer 21 and the undoped GaN layer 22 to expose the surface of the N-type GaN contact layer 23.

The light emitting diode element according to this embodiment has an improved light extracting efficiency without losses which may otherwise occur when the light passes through the sapphire substrate 1, the buffer layer 21 and the undoped GaN layer 22 and is reflected on the interfaces of these layers. In addition, the P-side electrode and the N-side electrode are disposed opposite from each other, so that electric current is evenly distributed and generation of heat from the element is suppressed.

Figure 6:
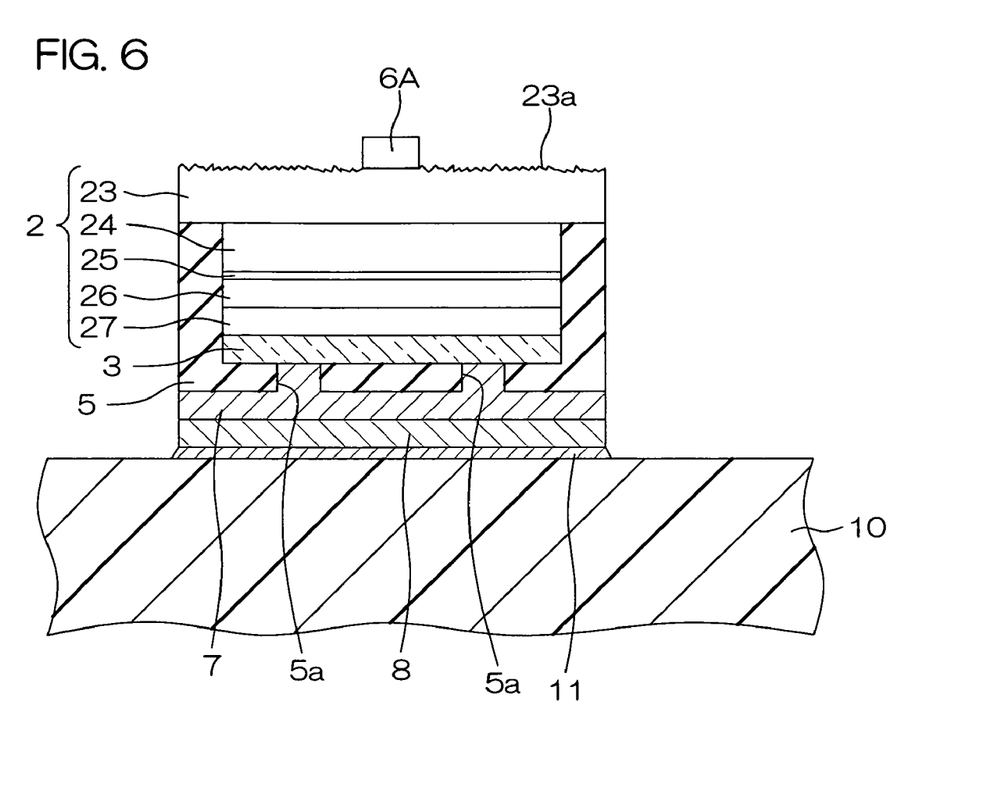
FIG. 6 is a schematic sectional view illustrating a variation of the construction of FIG. 5.
Figure 7:
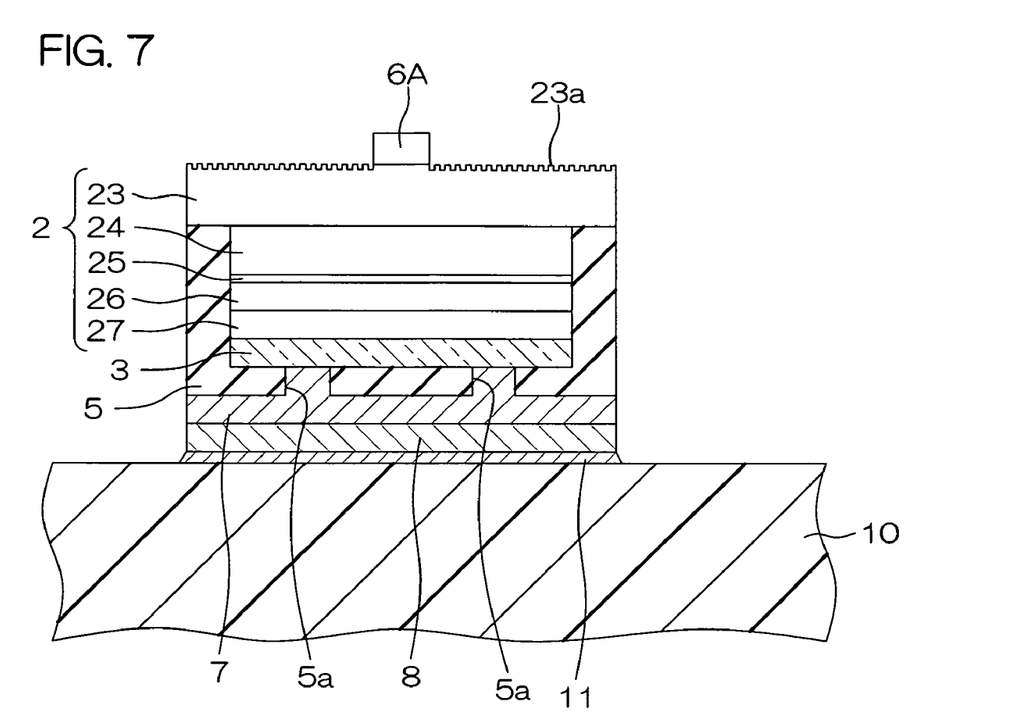
FIG. 7 is a schematic sectional view illustrating another variation of the construction of FIG. 5.

The surface 23a of the N-type GaN contact layer defined as the light extracting surface may be mirror-finished, but is preferably roughened as shown in FIG. 6 or regularly undulated (e.g., regularly dimpled) for increasing the light extraction efficiency. Particularly, where the element has a construction as shown in FIG. 7, the N-type GaN contact layer 23 is preferably entirely composed of a photonic crystal, thereby further improving the light extraction efficiency.

While the two embodiments of the present invention have thus been described, the invention may be embodied in any other way. Although the transparent insulation film 5 is disposed between the P-side transparent electrode 3 and the reflective electrode 7 in the embodiments described above, the surfaces of the P-side transparent electrode 3 and the reflective electrode 7 may entirely contact each other without the provision of the transparent insulation film 5. However, the provision of the transparent insulation film 5 is preferred for minimizing light absorption in the interface between the P-side transparent electrode 3 and the reflective electrode 7.

Further, an adhesive layer may be provided between the transparent insulation film 5 and the reflective electrode 7 for increasing adhesion between the transparent insulation film 5 and the reflective electrode 7. The adhesive layer may be formed, for example, by sputtering alumina ($Al_2O_3$) to a thickness of about 0.1 μm.

Although the embodiments described above are directed to the gallium nitride semiconductor light emitting device by way of example, the present invention is applicable to semiconductor light emitting devices based on other materials such as ZnSe, ZnO, GaAs, GaP, SiC and InAlGaP.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2004-205094 filed with the Japanese Patent Office on Jul. 12, 2004, the disclosure of which is incorporated herein by reference.

What is claimed is:

1. A semiconductor light emitting device comprising:
   a semiconductor light emitting portion having a first contact layer of a first conductivity, a second contact layer of a second conductivity and an active layer sandwiched between the first and second contact layers;
   a transparent electrode which substantially entirely covers a surface of the second contact layer in ohmic contact with the surface of the second contact layer and is transparent to a wavelength of light emitted from the semiconductor light emitting portion; and
   a metal reflection film which is opposed to substantially the entire surface of the transparent electrode and electrically connected to the transparent electrode, and reflects the light emitted from the semiconductor light emitting portion and passing through the transparent electrode toward the semiconductor light emitting portion;
   further comprising a transparent insulation film disposed between the transparent electrode and the metal reflection film, wherein
   the metal reflection film is connected to the transparent electrode via an opening formed in the transparent insulation film; and
   wherein the reflection film is provided on a surface portion of the transparent insulation film opposite from the semiconductor light emitting portion and substantially entirely covers a region of the transparent insulation film opposed to the semiconductor light emitting portion.

2. A semiconductor light emitting device as set forth in claim 1, further comprising a transparent substrate which is transparent to the wavelength of the light emitted from the semiconductor light emitting portion, and has a light extracting surface defined by one surface thereof through which the light emitted from the semiconductor light emitting portion is extracted to the outside, and a device formation surface defined by the other surface thereof on which the semiconductor light emitting portion is provided, the device formation surface of the transparent substrate being opposed to the first contact layer.

3. A semiconductor light emitting device as set forth in claim 1, further comprising an electrode portion extending from the first contact layer toward the metal reflection film.

4. A semiconductor light emitting device as set forth in claim 1, wherein
   the transparent electrode comprises a $Zn_{1-x}Mg_xO$ (wherein $0 \leq x < 1$) film.

5. A semiconductor light emitting device as set forth in claim 1, wherein
   the first contact layer has a light extracting surface defined by one surface thereof,
   the device further comprising an electrode provided on the light extracting surface opposite from the transparent electrode.

6. A semiconductor light emitting device as set forth in claim 5, wherein
   the light extracting surface is a roughened surface.

7. A semiconductor light emitting device as set forth in claim 5, wherein
   the light extracting surface is a regularly undulated surface.

8. A semiconductor light emitting device as set forth in claim 5, wherein
   the first contact layer is a photonic crystal layer.

9. A semiconductor light emitting device as set forth in claim 1, wherein the reflection of the light from the semiconductor light emitting portion occurs in an interface between the transparent insulation film and the metal reflection film.

10. A semiconductor light emitting device as set forth in claim 1, wherein a ratio of the area of the opening formed in the transparent insulation film to an area of the transparent electrode is 1 to 30%.

11. A semiconductor light emitting device as set forth in claim 1, wherein the thickness t of the transparent insulation film is $t=\lambda/(4n)\times(2m+1)$, where m is a zero or a positive integer, $\lambda$ is the wavelength of the light emitted from the semiconductor light emitting portion, and n is the refraction index of the transparent insulation film.

12. A semiconductor light emitting device as set forth in claim 1, comprising a plurality of the opening formed in the transparent insulation film, which openings expose minute surface portion areas of the transparent electrode.

13. A semiconductor light emitting device as set forth in claim 1, wherein the reflection film is connected to the transparent electrode via the opening formed in the transparent insulation film, whereby the transparent electrode and the reflective electrode are electrically connected.

* * * * *